United States Patent [19]

Harame et al.

[11] Patent Number: 5,024,957

[45] Date of Patent: Jun. 18, 1991

[54] METHOD OF FABRICATING A BIPOLAR TRANSISTOR WITH ULTRA-THIN EPITAXIAL BASE

[75] Inventors: David L. Harame, Mohegan Lake; Johannes M. C. Stork, Yorktown Heights, both of N.Y.

[73] Assignee: International Business Machines Corporation, Armonk, N.Y.

[21] Appl. No.: 309,510

[22] Filed: Feb. 13, 1989

[51] Int. Cl.$^5$ .......................................... H01L 21/306
[52] U.S. Cl. ........................................ 437/31; 437/33; 437/91; 437/99; 437/909; 437/203; 148/DIG. 11; 148/DIG. 154
[58] Field of Search ...................... 437/31, 99, 909, 32, 437/33, 90, 91, 203; 148/DIG. 10, DIG. 11, DIG. 154

[56] References Cited

U.S. PATENT DOCUMENTS

| | | | |
|---|---|---|---|
| 3,600,651 | 8/1971 | Duncan | 317/235 R |
| 4,319,932 | 3/1982 | Jambotkar | 357/34 |
| 4,495,512 | 1/1985 | Isaac et al. | 357/34 |
| 4,504,332 | 3/1985 | Shinada | 437/99 |
| 4,701,998 | 10/1987 | Ahlgren et al. | 437/31 |
| 4,830,972 | 5/1989 | Hamasaki | 437/31 |

FOREIGN PATENT DOCUMENTS 0143669  7/1985  Japan .................................. 437/909

OTHER PUBLICATIONS

Ho et al., "Polysilicon-Base Self-Aligned Bipolar Transistors Process and Structure", Defensive Publication T104, 102, 4/84.

*Primary Examiner*—Olik Chaudhuri
*Assistant Examiner*—Tuan Nguyen
*Attorney, Agent, or Firm*—Jeffrey L. Brandt

[57] ABSTRACT

A method of forming a bipolar transistor is provided, comprising the steps of: providing a semiconductor substrate including a first region of a first conductivity type; forming a layer of insulative material over a surface of the first region; forming a layer of conductive material over the layer of insulative material; patterning the first and second layers to form a generally vertical sidewall bounding an exposed portion of the first region surface; and epitaxially depositing a base region of a second conductivity type over the exposed portion of the first region surface and the sidewall such that the base region is in electrical contact with the second region.

12 Claims, 4 Drawing Sheets

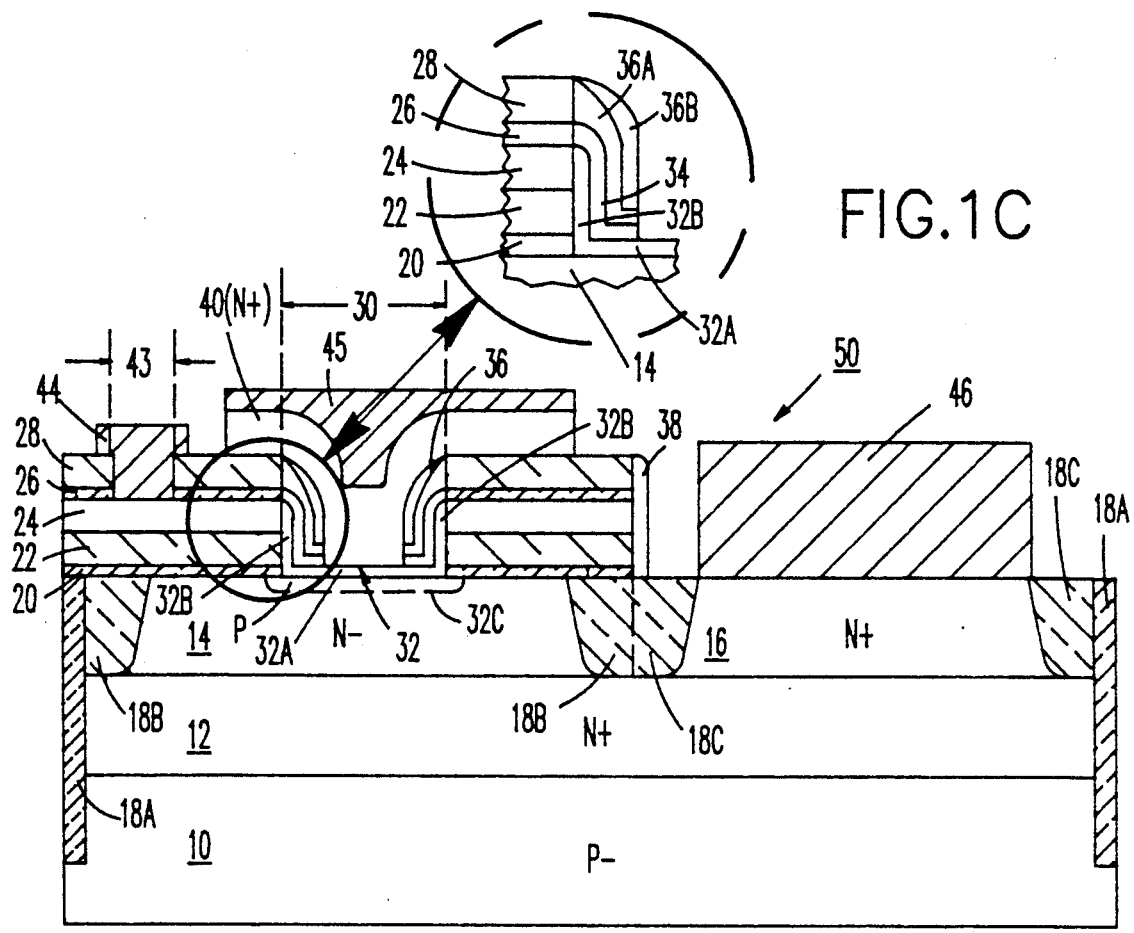
FIG.1C
FIG.1A
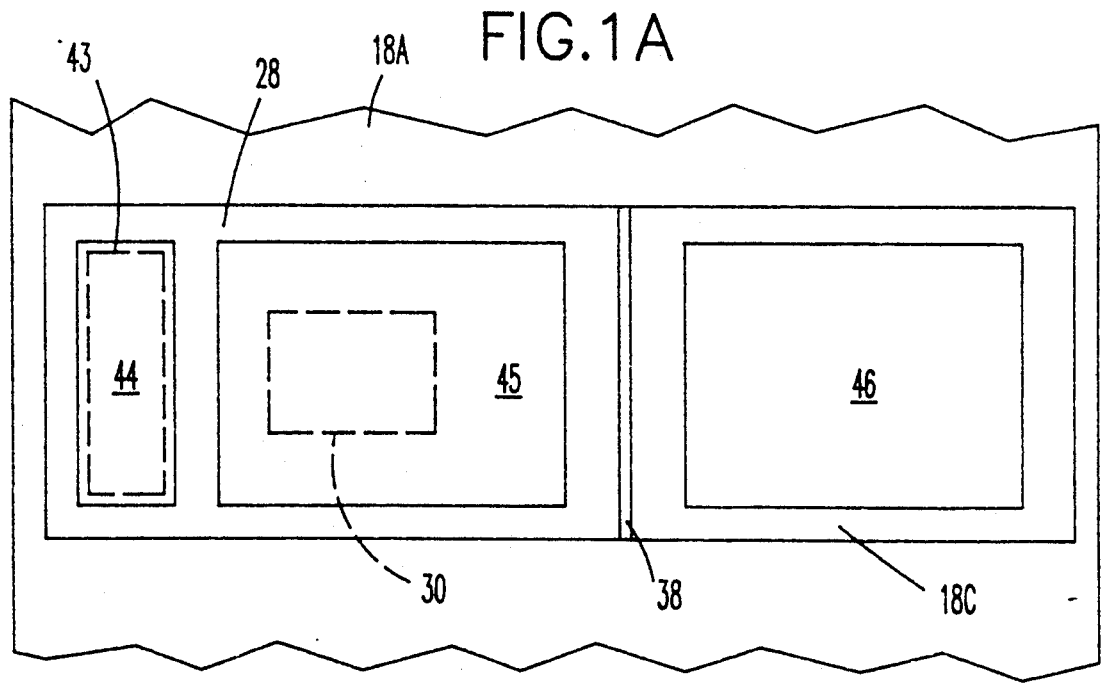
FIG.1B

METHOD OF FABRICATING A BIPOLAR TRANSISTOR WITH ULTRA-THIN EPITAXIAL BASE

The present invention relates generally to bipolar transistors, and more particularly to a bipolar transistor having an epitaxially grown base region and a method of fabricating the same.

BACKGROUND OF THE INVENTION

Recent attempts to increase the performance of bipolar logic (i.e. electronic logic circuits incorporating bipolar transistors/devices) have resulted in fabrication processes which yield smaller, more densely packed bipolar devices. . The use of these fabrication processes, including, for example, the so called self-aligned fabrication processes, permits the formation of bipolar transistors having structures formed to sub-micron resolution. Transistors formed using these processes tend to exhibit substantially decreased size and density, and substantially increased switching speeds, in comparison to prior art devices.

The following patents are of interest as showing various examples of self-aligning transistor fabrication processes and resulting devices.

U.S. Pat. No. 4,495,512 to Isaac et al., assigned to the assignee of the present invention, shows a bipolar transistor having a silicide extrinsic base contact with an overlying doped polysilicon layer. The silicide and polysilicon have coextensive apertures defining the intrinsic base and emitter regions. The extrinsic base region is formed by diffusing impurities from the doped polysilicon layer through the silicide layer.

U.S. Pat. No. 4,483,726 to Isaac et al., assigned to the assignee of the present invention, shows a bipolar transistor having a small, self-aligned sidewall contact to the extrinsic base. The extrinsic base region is fabricated by forming the doped contact/sidewall between two layers of insulating material, and diffusing impurities from the contact to form the extrinsic base region. The intrinsic base and emitter regions are formed in the silicon through an aperture defined by insulative sidewalls formed over the extrinsic base contact.

U.S. Pat. No. 4,319,932 to Jamboktar, assigned to the assignee of the present invention, shows a bipolar transistor formed by employing polysilicon base contacts self-aligned with respect to a diffusion or ion implantation window used to form emitter, intrinsic base, and raised subcollector regions. The polysilicon acts as a self-aligned impurity source to form the extrinsic base region therebelow, and after being coated with silicon dioxide on the surface and along the sidewalls of the diffusion or ion implantation window, as a mask.

U.S. Pat. No. 4,157,269 to Ning et al., assigned to the assignee of the present invention, shows a method of manufacturing a bipolar transistor having base contacts formed of polysilicon material and an emitter contact formed of polysilicon material or metal. The emitter contact is self-aligned to the base contacts by the use of process steps wherein a single mask aperture is used for defining the base contacts and the emitter.

Defensive Publication T104,102 to Ho et al. shows a method of making a bipolar transistor having a polysilicon base contact from which an extrinsic base region is out-diffused. The polysilicon contact is self-aligned with the emitter region.

As advances are made in decreasing the size and increasing the density of bipolar devices, device capacitances and parasitic actions become increasingly limiting factors in device speed. In vertical devices, the electrical base contact-to-substrate capacitance tends to establish parasitic device actions which limit device speed. A lack of symmetry in the base and emitter regions, caused by deficiencies inherent in known fabrication processes, also tends to establish these parasitic actions and hence similarly limit device switching speeds.

SUMMARY OF THE INVENTION

The principle object of the present invention is to provide new and improved bipolar transistors and methods of fabricating the same.

Another object of the present invention is to provide new and improved bipolar transistors which exhibit increased switching speed in comparison to prior art devices.

A further object of the present invention is to provide new and improved bipolar transistors exhibiting decreased device capacitances and decreased parasitic actions in comparison to prior art devices.

Yet another object of the present invention is to provide new and improved bipolar transistors having ultra-thin base regions.

A further object of the present invention is to provide new and improved bipolar transistors having highly symmetrical structures.

Another object of the present invention is to provide a method of fabricating the above-described bipolar transistors which can be economically implemented using conventional semiconductor manufacturing techniques.

In accordance with the present invention, a new and improved method of forming a bipolar transistor is provided, comprising the steps of: providing a semiconductor substrate including a first region of first conductivity type; forming a layer of insulative material over a surface of the first region; forming a layer of conductive material over the layer of insulative material; patterning the layers of insulative and conductive materials to form a generally vertical sidewall bounding an exposed portion of the first region surface; and epitaxially depositing a base region of a second conductivity type over the exposed portion of the first region surface and the sidewall such that the base region is in electrical contact with the layer of conductive material.

The step of epitaxially depositing a base region is preferably performed as a chemical vapor deposition (CVD) process, such that the portion of the base region overlying the exposed portion of the first region is monocrystalline in structure and the portion of the base region overlying the sidewall is polycrystalline in structure.

In accordance with another aspect of the present invention, a bipolar transistor is provided, comprising: a semiconductor substrate including a first region of a first conductivity type; a layer of insulative material over a surface of the first region; a layer of conductive material over the layer of insulating material; an aperture patterned in the layers of insulative and conductive materials to define a generally vertical sidewall bounding an exposed portion of the first region surface; and an epitaxial base region of a second conductivity type disposed over the exposed portion of the first region surface and the sidewall such that the base region is in electrical contact with the layer of conductive material.

In a preferred embodiment of the invention, the portion of the base region overlying the exposed portion of the first region is monocrystalline in structure and the portion of the base region overlying said sidewall is polycrystalline in structure. The base region is preferably formed using a CVD process.

BRIEF DESCRIPTION OF THE DRAWINGS

These and other objects, features and advantages of the present invention will become apparent upon a consideration of the following detailed description of the invention when read in conjunction with the drawing Figures, in which:

FIG. 1A shows a sectional view of a bipolar transistor constructed in accordance with the present invention;

FIG. 1B shows a top view of the bipolar transistor of FIG. 1A; and

DETAILED DESCRIPTION OF THE INVENTION

Figure 2:
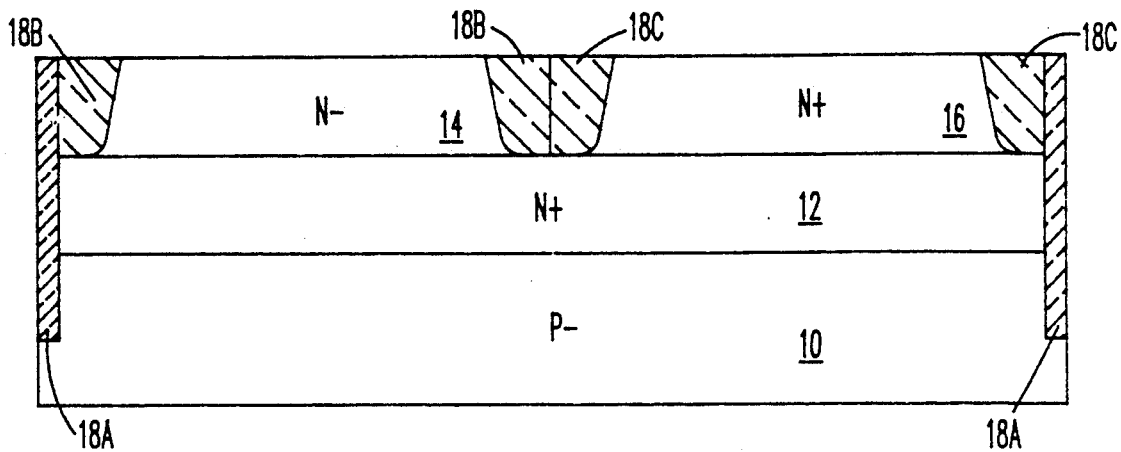
FIGS. 2–9 show subsequent steps in the fabrication of the bipolar transistor of FIGS. 1A, 1B in accordance with the present invention.

While an NPN type bipolar transistor is shown and described below, it will be understood by those skilled in the art that the invention is equally applicable to the construction of a PNP type bipolar transistor through the substitution of opposite conductivity type materials.

Referring now to FIGS. 1A and 1B, a bipolar transistor 50 is shown fabricated on a slab or chip of semiconductor material comprising a P− substrate region 10 overlain by an N+ buried sub-collector region 12. An epitaxially grown semiconductor region, formed over the upper surface of device region 12, has been processed to provide an N− collector region 14 overlying the surface of region 12, and an N+ sub-collector reachthrough region 16 also overlying the surface of region 12 and insulated from the collector region. Collector region 14 can be formed, for example, by the conventional growth of a lightly doped epitaxial silicon layer followed by conventional masking, ion implantation, and drive-in processes. Sub-collector reachthrough region 16 can be formed, for example, by deep ion implantation doping of the above-described epitaxial silicon so as to achieve the desired N+ conductivity. Alternatively, regions 14 and 16 can be formed directly in region 12 through appropriate doping of the latter.

Shallow isolation trenches 18B, 18C, filled for example with silicon dioxide, surround and electrically isolate regions 14, 16, respectively, to a depth approximately equal to the top of sub-collector region 12. A deeper isolation trench 18A, extending down into substrate region 10 and filled for example with silicon dioxide, surrounds transistor 50 so as to electrically isolate the transistor from other devices (not shown) fabricated on the same slab of silicon.

Overlying at least portions of isolation trenches 18A, 18B and the substantially planar upper surface of N+ collector region 14 are five consecutive, generally horizontal material layers including: an insulating layer 20 of an oxide; an insulating layer 22 of a nitride, an oxynitride, or nitride-oxide; a conductive layer 24 of highly doped polysilicon, polycide, or a refractory metal; an insulating layer 26 of an oxide; and an insulating layer 28 of a nitride. All five layers 20, 22, 24, 26, 28 are patterned to provide an aperture 30 having a generally vertical sidewall and being centered generally over the upper surface of collector region 14. The upper two material layers 26, 28 are further patterned to provide an aperture 43, laterally spaced from aperture 30, whereby to expose a portion of conductive layer 24.

Disposed within aperture 30 is a thin, epitaxially formed, lightly doped semiconductor base region 32 comprising a horizontally disposed monocrystalline layer 32A overlying the upper surface of region 14, and a vertically disposed polycrystalline layer or sidewall 32B coextensive with the vertical edges of layers 20 and 22, contacting the vertical edge of layer 24, and preferably terminating just below the bottom surface of layer 26. Base region 32 can comprise, for example, epitaxial silicon or silicon-germanium. Base region 32 further includes a region indicated by dashed line 32C whereat impurities from horizontal layer 32A have diffused outward into collector region 14. It is important to note that the edges of region 32C extend laterally past the side-walls defined by aperture 30.

A sidewall 34 of wet-etchable, reactive ion etch (RIE) stop, for example a 150 Angstrom thick layer of oxide, overlies vertical layers 32B of base region 32, and further includes an L-shaped leg extending a short distance over the horizontal, monocrystalline base region 32A. An RIE etchable, electrically insulating sidewall 36 overlies sidewall 34 and the vertical edges of layers 26, 28. Sidewall 36 comprises, for example, two registered layers including a first, generally L-shaped layer 36A of 600 Angstroms of nitride overlain by a second layer 36B of 600 Angstroms of oxide.

A sidewall formation 38, generally identical in construction to the overlying sidewall layers 34, 36A, 36B described immediately above, is formed over the vertical edges of layers 20, 22, 24, 26, 28 a short distance from sub-collector reachthrough region 16.

Continuing to describe FIGS. 1A, 1B, an emitter region 40, delineated from a layer of N+ doped polysilicon, is situated over base region 32A, sidewall 36, and a portion of the upper surface of nitride layer 28. Emitter region 40 can alternately comprise an N+, single-crystal epitaxial layer. A metal base contact 44 is positioned in electrical contact with the region of polysilicon layer 24 exposed in aperture 43. Metal emitter and collector contacts 45, 46 are positioned in electrical contact with the top of emitter region 40 and the upper surface of sub-collector reachthrough region 16, respectively.

As constructed in the manner described above, vertical base region 32B makes electrical contact with doped, conductive polysilicon layer 24, which in turn forms an electrical link with metal base contact 45. Horizontal base region 32A functions as an intrinsic base, while vertical base region 32B and the interconnecting portion of layer 24 function as an extrinsic base.

Because polysilicon layer 24 is spaced from the surface of collector region 14 by intervening insulating layers 20, 22, the base-contact/epi region capacitance of device 50 is substantially lower than that of prior art devices. An even further decrease in capacitance is provided by the non-diffused nature of the electrical connection between polysilicon layer 24 and epitaxially formed vertical base region 32B.

The decreased capacitances inherent in the structure of transistor 50 provide a substantial increase in the operating (i.e. switching) speed with respect to prior art devices. The epitaxial nature of base region 32 permits the the region to be ultra-thin (i.e. on the order of 200-500 Angstroms) and highly symmetrical in shape.

Referring now to FIGS. 2-9, a method is described for fabricating bipolar transistor 50 in accordance with the present invention. Like features to those described above are indicated with like reference numbers.

Referring now to FIG. 2, the above-described device is fabricated on a silicon semiconductor wafer shown in the Figure to have a P− substrate region 10 overlain by an N+ subcollector region 12. The initial wafer can be fabricated, for example, by pulling a monocrystalline rod from a suitable melt containing a P− type material, such as boron, using a seed crystal having a <100> crystallographic orientation. The resulting rod is then sliced into thin wafers which also have the surface crystallographic orientation of <100>. The P− silicon wafer preferably has a resistivity of 10-20 ohm-cm. N+ sub-collector region 12 is formed by the use of conventional ion implantation and drive in processes to a thickness in the range of about 1.5 microns.

Continuing to describe the structure of FIG. 2, N− collector region 14 and N+ sub-collector reach-through region 16 are formed by first growing a lightly doped silicon layer (not shown) epitaxially over the surface of sub-collector region 12. This epitaxial layer is formed, for example, by conventional epitaxial growth processes to a thickness in the range of about 1.2 microns. Subsequent to the formation of the epi-layer, shallow isolation trenches 18B, 18C are formed by the conventional processes of: masking, etching to form the shallow trenches, oxidizing the exposed silicon, filling the oxidized trenches with layers of insulating material such as silicon dioxide, and appropriately planarizing the resulting surface. Deep isolation trench 18A is formed, for example, by the conventional processes of: etching to form the deep trench, oxidizing the walls of the exposed silicon, filling any remaining void with a filler material such as an oxide or a polysilicon, and planarizing the surface of the resulting isolation trench.

N− region 14 is formed by conventional masking, ion implantation, and drive in processes to obtain the desired N− conductivity region. N+ region 16 is likewise formed by conventional masking, deep ion implantation, and drive in processes to obtain the desired N+ conductivity region. Alternatively, it will be understood that N− and N+ regions 14, 16, respectively, can be formed directly in N− region 12 by applying the above-described isolation and doping processes directly to region 12.

Figure 3:
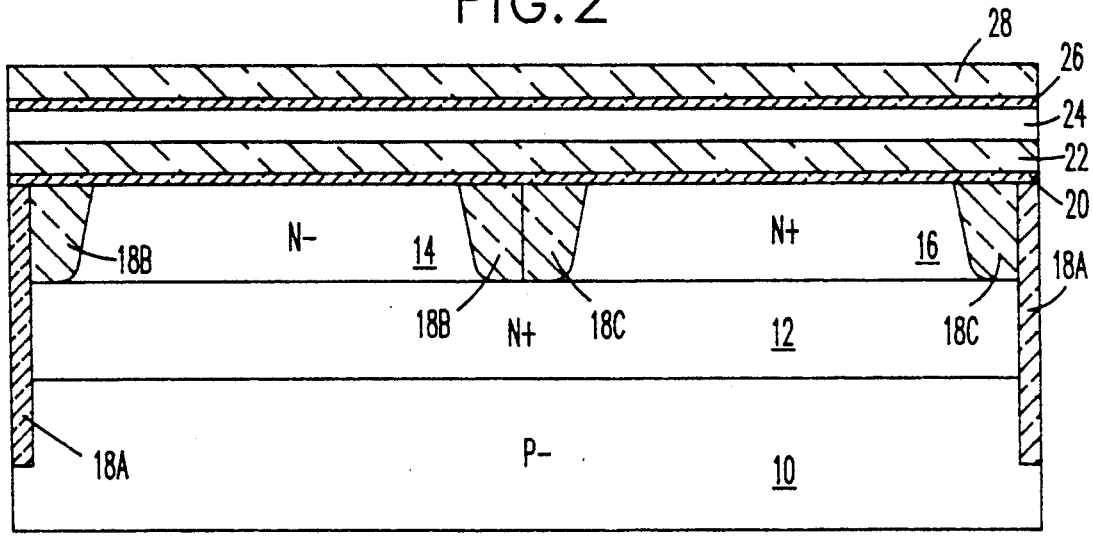

Referring now to FIG. 3, a five layer stack is formed over the upper surface of the device shown in the previous Figure. A layer 20 of oxide is formed directly over the device surface, for example by a process of thermal oxidation and to a thickness in the range of about 200 Angstroms. A layer 22 of nitride is formed over oxide layer 20, for example by a process of low pressure chemical vapor deposition (LPCVD) and to a thickness in the range of about 200 Angstroms. These bottom two layers 20, 22 function primarily to provide electrical isolation from the underlying device regions, and other appropriate material(s) may be substituted therefor. Oxide layer 20 functions secondarily as a wet etch stop for the RIE etchable nitride layer 22 in a manner that is described in further detail below. Again, other appropriate materials will be apparent to those skilled in the art.

A conductive layer 24, preferably comprising P+ doped polysilicon, is formed over nitride layer 22. Conductive layer 24 is formed, for example, by LPCVD formation of an in situ doped polysilicon to a thickness in the range of about 2,500 Angstroms. Conductive layer 24 functions primarily as a conductive link between a subsequently added electrical contact and a subsequently formed base region. Other appropriate conductive materials, including, for example, refractory metals and polycides, may be substituted therefor.

Subsequent to the formation of conductive layer 24, electrically insulating layers 26 and 28 are formed consecutively thereon. Layer 26 preferably comprises an oxide, formed, for example, by LPCVD to a thickness in the range of about 1000 Angstroms. Layer 28 preferably comprises a nitride formed, for example, by LPCVD to a thickness in the range of about 1000 Angstroms. Layers 26 and 28 function primarily to provide electrical isolation for subsequently formed metal contacts, and other material(s) exhibiting appropriate characteristics may be substituted therefor.

Figure 4:
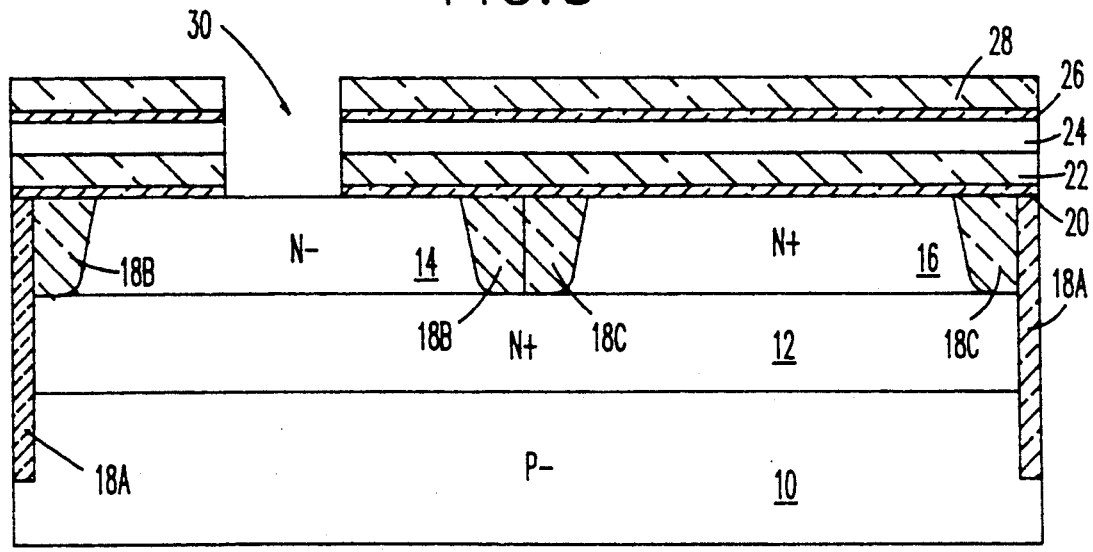

Referring now to FIG. 4, conventional photolithographic masking (not shown) is used to define the boundaries for an aperture 30 formed in the five layer stack and generally centered on the surface of region 14. An RIE process, for example comprising a mixture of $CF_4$ and $CF_4 + O_2$, is used to anisotropically and selectively etch layers 28, 26, 24, 22, successively, the RIE etch being effectively stopped by bottom oxide layer 20. A wet etch, for example BHF or HF, is used to remove the portion of oxide layer 20 exposed in aperture 30. In accordance with an advantage provided by the present invention, the wet etch of oxide layer 20 may be carefully, selectively controlled, so as to not damage the subsequently exposed silicon surface of collector region 14. The exposed silicon surface is thus relatively clean and uniform, approaching an ideally planar surface. This feature of the present invention obviates the well-recognized problems associated with non-uniform silicon surfaces resulting, for example, from RIE processing. These obviated problems include, for example, unpredictable device operation and unwanted parasitic device actions.

Figure 5:
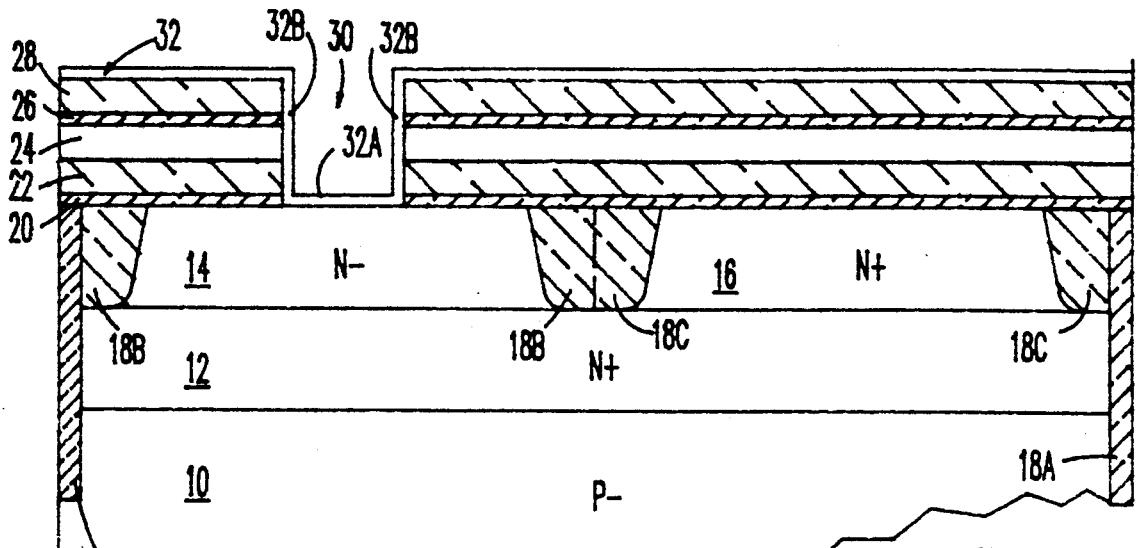

Referring now to FIG. 5, a layer 32 of in situ doped epitaxial silicon (or silicon-germanium) is deposited conformally over the surface of the device shown in the preceding Fig. Layer 32 is preferably formed by a process of ultra-high vacuum, chemical vapor deposition (UHV/CVD). This process entails placing the device into an ultra-high vacuum of less than $1 \times 10^{-8}$ torr to clean the surface. A low temperature of about 560 degrees centigrade is used during the cleaning and deposition steps, with the deposition being performed at a pressure of about 1 militorr. The epitaxial silicon is deposited in the presence of a P type dopant, such as diborane, to provide a desired light doping in the range of about $1 \times 10$ atoms per cubic centimeter.

Thusly formed in accordance with the the present invention, layer 32 provides a base region within aperture 30 comprising a monocrystalline, horizontal, intrinsic base portion 32A overlying the exposed surface of collector region 14, and a polycrystalline, vertical, extrinsic base sidewall portion 32B extending over the vertical edges of the stacked layers 20, 22, 24, 26, 28. During a subsequent annealing process, described below, sidewall region 32B of the epitaxially formed base region forms an electrical link-up with the adjoining vertical edge of conductive polysilicon layer 24, the polysilicon layer thus also forming a portion of the extrinsic base region for the subsequently completed device. During this annealing process, impurities from base region 32A diffuse outward into region 14, forming intrinsic base region 32C.

Figure 6:
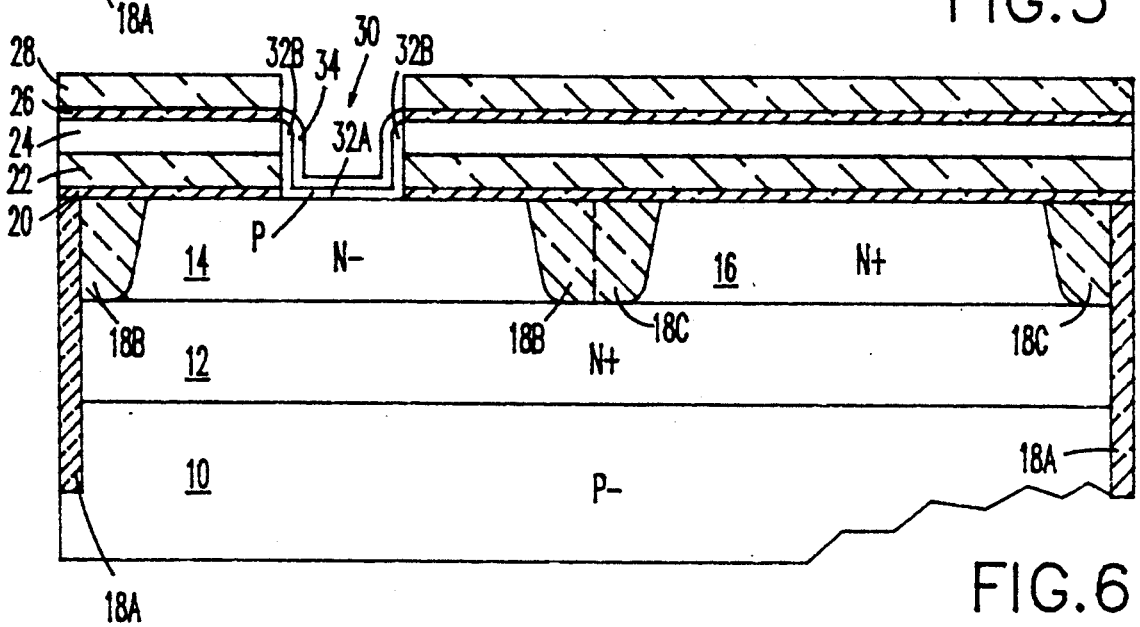

Referring now to FIG. 6, the device is subjected to a resist planarization, preferably using a resist oxide so as to form a resist plug (not shown) in aperture 30 having a height about equal to the top of layer 24. The exposed portions of layer 32 are removed using an isotropic silicon plasma etch, such as $CF_4$ plasma, to leave only horizontal layer 32A and sidewall layer 32B. Sidewall layer 32B extends vertically upward from the surface of region 14 at least into contact with the edge of doped polysilicon layer 24, but preferably not into contact with the edge of overlying insulator region 26.

Figure 7:
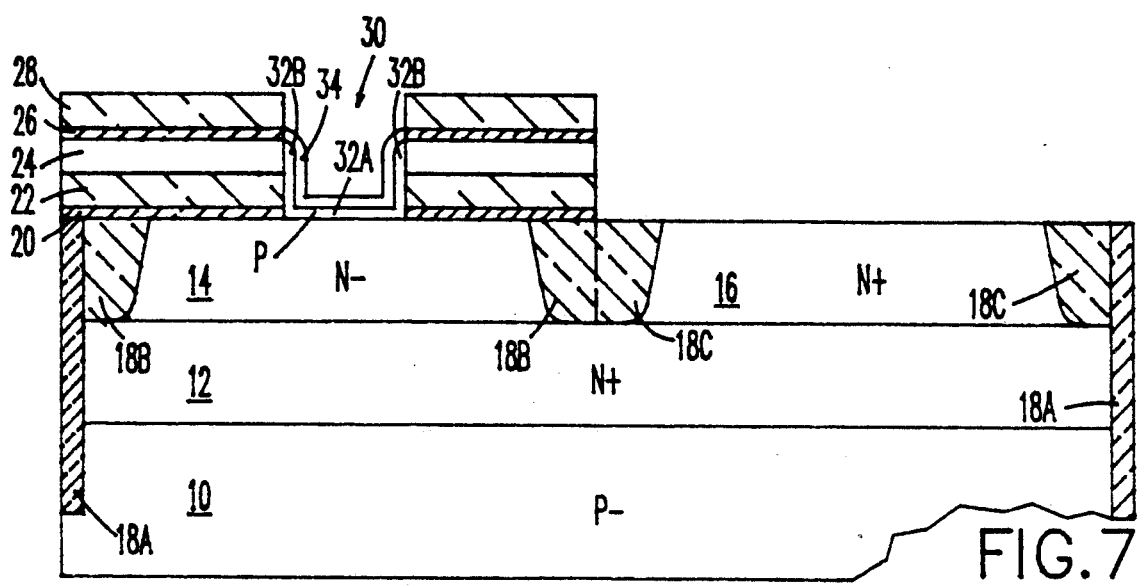

Referring now to FIG. 7, a layer 34 of high-pressure, thermal oxide (HIPOX) is grown over the exposed silicon of base regions 32A, 32B. (It will be appreciated that oxide layer 34 would likewise form over any exposed edge portions of layer 24 within aperture 30).

Optionally, a layer (not shown) of plasma-enhanced CVD oxide can be deposited conformally over epitaxial silicon layer 32 (FIG. 5), and wet etched just after the formation of the resist plug and prior to the etching of the silicon layer so as to form a covering layer over base regions 32A, 32B. This covering layer could be used in addition to or in lieu of oxide layer 34, to form insulative sidewalls in the manner described below.

Conventional photolithographic masking (not shown) is used in combination with the above described $CF_4$ and $CF_4+O_2$ RIE and wet etch processes to remove the right-most portions of stacked layers 20, 22, 24, 26, 28, thereby exposing shallow isolation trench 18C, the upper surface of sub-collector reachthrough region 16, and the portion of deep isolation trench 18A surrounding the reachthrough region.

Figure 8:
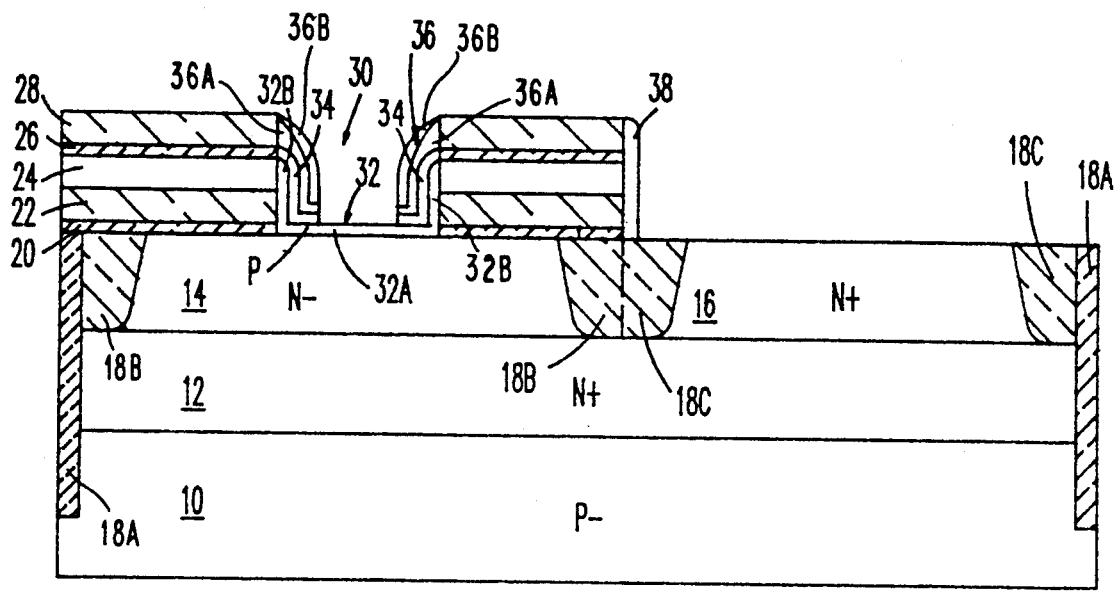

Referring now to FIG. 8 and to the detail view of FIG. 1C, sidewalls comprised of oxide layer 34, a nitride layer 36A, and an oxide layer 36B are formed consecutively over the sidewall layer 32A of base region 32. Sidewalls 36A and 36B are formed, for example, by a conformal CVD of nitride and oxide layers (not shown), followed by an anisotropic RIE process so as to leave the sidewalls. Because oxide layer 34 has a different etch characteristic than overlying nitride layer 36A, a final wet etch with, for example, BHF, is used to remove the unwanted portions of layer 34 without damaging the exposed surface of base region 32B.

Simultaneous with the formation of sidewalls 34, 36A, 36B, an identical sidewall 38, the multi-layer structure of which is not visible in the Figs., is formed over the vertical edges of layers 20, 22, 24, 26, 28 overlying shallow isolation trench 18C.

In accordance with the present invention, sidewall structure 36 functions primarily to electrically isolate a subsequently formed emitter region from the extrinsic base region 32A, while oxide layer 34 functions primarily as a stop for the RIE etch used to form sidewall 36. It will thus be apparent to those skilled in the art that other material(s) exhibiting appropriate characteristics can be substituted therefor.

Figure 9:
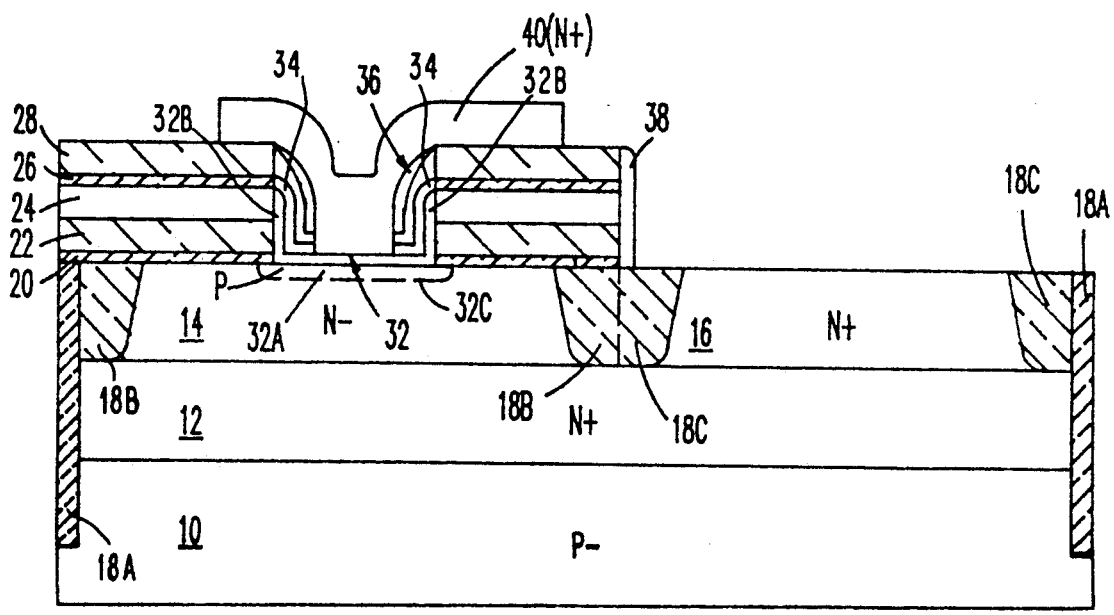

Referring now to FIG. 9, subsequent to the formation of sidewalls 36, an emitter region 40 of N+ doped polysilicon is formed over base region 32B, sidewalls 36, and portions of the upper surface of layer 28. Emitter region 40 is formed, for example, by first forming an LPCVD layer of undoped polysilicon (not shown) to a thickness in the range of about 2000 Angstroms. Arsenic ions are implanted and annealed into the polysilicon to achieve the desired dopant concentration, for example in the range of about $1 \times 10^{21}$ atoms per cubic centimeter. During this annealing process, the heavily doped P+ layer 24 forms an electrical link-up with the lightly doped base region sidewall 32B. At the same time, impurities from base layer 32A diffuse outward into region 14 so as to form region 32C.

The doped polysilicon is subsequently patterned with conventional photolithographic masking and etching processes to provide the emitter region shown in FIG. 9. Emitter region 40 can alternately be formed as a single crystal epitaxial layer.

To complete the bipolar transistor 50 of FIGS. 1A, 1B, conventional photolithographic masking and etching techniques are used to open aperture 43 to layer 24. A metal deposition process such as sputtering is used to form base, emitter and collector contacts 44, 45, and 46, respectively. An etchant such as $CF_4$, for example, can be used to open aperture 43. Metal contacts 44, 45, 46 can be formed, for example, from an alloy of titanium and aluminum.

There has thus been described a bipolar transistor, and a self-aligning method of fabricating the same, having the features of an ultra-thin base region, a highly symmetrical structure, and an extrinsic base region electrically well isolated from the underlying epitaxial/substrate regions. These features provide the substantial advantages of decreased capacitance and parasitic action, resulting in increased switching speed. The present invention can be practiced with economical, known semiconductor processing techniques, and has industrial application in the fabrication of semiconductor logic and memory chips supporting a multiplicity of such bipolar devices.

While the present invention has been shown and described with respect to a preferred embodiment, it will be understood that numerous changes, modifications, and improvements will occur to those skilled in the art without departing from the spirit and scope of the invention.

What is claimed is:

1. A method of forming a bipolar transistor comprising the steps of:

providing a semiconductor substrate including a first region of a first conductivity type;

forming a layer of insulative material over a surface of said first region;

forming a layer of conductive material over said layer of insulative material;

patterning said layers of insulative and conductive materials to form a generally vertical sidewall bounding an exposed portion of said first region surface;

epitaxially depositing a base region of a second conductivity type over said exposed portion of said first region surface and said sidewall such that said base region is in electrical contact with said layer of conductive material, and such that an intrinsic portion of said base region overlying said exposed portion of said first region is monocrystalline in structure and an extrinsic portion of said base region overlying said sidewall is polycrystalline in structure;

patterning said extrinsic portion of said base region so that said extrinsic portion of said base region terminates over said layer of conductive material;

forming an insulative region over said extrinsic portion of said base region; and forming a second region of semiconductor material of said first conductivity type over said intrinsic portion of said base region.

2. A method in accordance with claim 1 wherein said step of epitaxially depositing a base region further includes the steps of:
   forming said base region as a thin conformal layer over an entire surface of said semiconductor substrate; and
   selectively removing portions of said thin conformal layer to leave said base region.

3. The method of claim 1 and further including the step of heating said substrate at least once to form the electrical connection between said extrinsic portion of said base region and said conductive layer.

4. The method of claim 1 wherein said base region is deposited in situ doped.

5. A method of forming a bipolar transistor comprising the steps of:
   providing a semiconductor substrate including a first region of a first conductivity type;
   forming a first layer of insulative material having a first etch characteristic over a surface of said first region;
   forming a second layer of insulative material having a second etch characteristic over said first layer of insulative material;
   forming a first layer of conductive material over said second layer of insulative material;
   forming a third layer of insulative material over said first layer of conductive material;
   etching said first layer of conductive material and said second and third layers of insulative material with a first etchant to expose a portion of said first layer of insulative material;
   etching the exposed portion of said first layer of insulative material with a second etchant to form a generally vertical sidewall bounding an exposed portion of said first region surface;
   epitaxially depositing a base region of a second conductivity type over said exposed portion of said first region surface and said sidewall such that said base region is in electrical contact contact with said first layer of conductive material, and such that an intrinsic portion of said base region overlying said exposed portion of said first region is monocrystalline in structure and an extrinsic portion of said base region overlying said sidewall is polycrystalline in structure;
   patterning said extrinsic portion of said base region so that said extrinsic portion of said base region terminates over said layer of conductive material;
   forming an insulative spacer over said extrinsic portion of said base region and the exposed portions of said sidewall; and
   forming a second region of said first conductivity type over said base region and said spacer.

6. A method in accordance with claim 5 wherein said step of epitaxially depositing a base region further includes the steps of:
   forming said base region as a thin conformal layer over an entire surface of said semiconductor substrate; and
   selectively removing portions of said thin conformal layer to leave said base region.

7. A method in accordance with claim 6 wherein:
   said substrate comprises silicon;
   said first layer of insulating material comprises silicon dioxide;
   said second layer of insulating material comprises silicon nitride; and
   said base region comprises silicon or silicon-germanium.

8. A method in accordance with claim 7 wherein said first layer of conductive material comprises a doped polysilicon, a polycide, or a refractory metal.

9. A method in accordance with claim 7 wherein said third layer of insulative material comprises stacked layers of silicon dioxide and silicon nitride.

10. A method in accordance with claim 7 wherein said third layer of insulative material comprises consecutively stacked layers of silicon dioxide, silicon nitride, and silicon dioxide.

11. The method of claim 5 and further including the step of heating said substrate at least once to form the electrical connection between said extrinsic portion of said base region and said conductive layer.

12. The method of claim 5 wherein said base region is deposited in situ doped.

* * * * *

UNITED STATES PATENT AND TRADEMARK OFFICE
CERTIFICATE OF CORRECTION

PATENT NO. : 5,024,957
DATED : June 18, 1991
INVENTOR(S) : David L. Harame & Johannes M. C. Stork It is certified that error appears in the above-identified patent and that said Letters Patent is hereby corrected as shown below:

Column 3, line 61    Delete "N+" and insert -- N- --.

Column 6, line 55    Delete "1X10" and insert
                     -- $1X10^{19}$ --.

Signed and Sealed this

Twenty-fifth Day of May, 1993

Attest:

MICHAEL K. KIRK

Attesting Officer    Acting Commissioner of Patents and Trademarks